United States Patent
Gan et al.

(10) Patent No.: US 11,664,820 B2
(45) Date of Patent: May 30, 2023

(54) DOMAIN ADAPTATION

(71) Applicant: Nokia Technologies Oy, Espoo (FI)

(72) Inventors: Shaoduo Gan, Zurich (CH); Akhil Mathur, London (GB); Anton Isopoussu, Cambridge (GB)

(73) Assignee: Nokia Technologies Oy, Espoo (FI)

( * ) Notice: Subject to any disclaimer, the term of this patent is extended or adjusted under 35 U.S.C. 154(b) by 320 days.

(21) Appl. No.: 16/891,697

(22) Filed: Jun. 3, 2020

(65) Prior Publication Data

US 2021/0089872 A1    Mar. 25, 2021

(30) Foreign Application Priority Data

Sep. 25, 2019 (FI) .................................... 20195817

(51) Int. Cl.
*H03M 7/30* (2006.01)
*G06N 3/088* (2023.01)

(52) U.S. Cl.
CPC .......... *H03M 7/6064* (2013.01); *G06N 3/088* (2013.01); *H03M 7/6011* (2013.01)

(58) Field of Classification Search
CPC .. H03M 7/6064; H03M 7/6011; G06N 3/088; G06N 3/084; G06N 3/0454; G06N 3/08; G06N 20/00

See application file for complete search history.

(56) References Cited

U.S. PATENT DOCUMENTS

| | | | |
|---|---|---|---|
| 11,270,079 B2* | 3/2022 | Tu | .............. G06F 40/30 |
| 2018/0218284 A1 | 8/2018 | Jawahar et al. | |
| 2019/0026869 A1* | 1/2019 | Gupta | .................. G06N 3/0454 |
| 2020/0160153 A1* | 5/2020 | Elmoznino | ............ G06N 20/00 |
| 2021/0019629 A1* | 1/2021 | Chidlovskii | ......... G06K 9/6267 |
| 2021/0216818 A1* | 7/2021 | Umeda | ................. G06K 9/6256 |
| 2022/0028038 A1* | 1/2022 | Yin | ...................... G06K 9/6259 |

FOREIGN PATENT DOCUMENTS

CN    109669009 A    4/2019

OTHER PUBLICATIONS

Eric et al., Adversarial Discriminative Domain Adaptation (Year: 2017).*

(Continued)

*Primary Examiner* — Mohammad K Islam
(74) *Attorney, Agent, or Firm* — Mintz Levin Cohn Ferris Glovsky and Popeo, P.C.

(57) ABSTRACT

An apparatus, method and computer program is described comprising: initialising weights of a target encoder based on a source encoder; initialising weights of a target discriminator associated with the target encoder such that the target discriminator is initialised to match a source discriminator associated with the source encoder; applying some of a target data set to the target encoder to generate target encoder outputs; applying the target encoder outputs to the target discriminator to generate a first local loss function output; training the target encoder to seek to increase the first local loss function output; training the target discriminator to seek to decrease the first local loss function output; and synchronising weights of the target discriminator and the source discriminator.

20 Claims, 9 Drawing Sheets

(56) References Cited

OTHER PUBLICATIONS

Laradji et al. (M-ADDA: Unsupervised Domain Adaptation with Deep Metric Learning (Year: 2018).*
Liu et al. ,Coupled Generative Adversarial Networks (Year: 2016).*
Han et al. , Improving Cross-database Face Presentation Attack Detection via Adversarial Domain Adaptation, IEEE (Year: 2019).*
Tanaka et al. ,ATTS2S-VC: Sequence-to-Sequence Voice Conversion With Attention and Context Preservation MEC,IEEE (Year: 2019).*
Chadha et al. , Improved Techniques for Adversarial Discriminative Domain Adaptation, IEEE (Year: 2019).*
Ganin et al., "Unsupervised Domain Adaptation by Backpropagation", Proceedings of the 32nd International Conference on International Conference on Machine Learning, vol. 37, Jul. 2015, 10 pages.
Tzeng et al., "Adversarial Discriminative Domain Adaptation", arXiv, Feb. 17, 2017, 10 pages.
Zhang et al., "Bridging Theory and Algorithm for Domain Adaptation", arXiv, Jul. 22, 2019, 10 pages.
Li et al., "Parameter Server for Distributed Machine Learning", Big Learning NIPS, 2013, pp. 1-10.
"Federated Learning: Collaborative Machine Learning without Centralized Training Data", Google AI Blog, Retrieved on May 27, 2020, Webpage available at : https://ai.googleblog.com/2017/04/federated-learning-collaborative.html.
Tang et al., "Communication Compression for Decentralized Training", arXiv, Jan. 31, 2019, pp. 1-32.
Yao et al., "Federated Learning with Additional Mechanisms on Clients to Reduce Communication Costs", arXiv, Sep. 1, 2019, pp. 1-12.
Mohri et al., "Agnostic Federated Learning", arXiv, Feb. 1, 2019, pp. 1-30.
Chen et al., "FedHealth: A Federated Transfer Learning Framework for Wearable Healthcare", arXiv, Jul. 22, 2019, 8 pages.
Mudrakarta et al., "K for the Price of 1: Parameter-efficient Multi-task and Transfer Learning", arXiv, Feb. 24, 2019, pp. 1-15.
Rozantsev et al., "Beyond Sharing Weights for Deep Domain Adaptation", arvix, Mar. 21, 2016, pp. 1-16.
Liu et al., "Unsupervised Image-to-Image Translation Networks", arXiv, Jul. 23, 2018, pp. 1-11.
Liu et al., "Coupled Generative Adversarial Networks", arXiv, 29th Conference on Neural Information Processing Systems Sep. 20, 2016, pp. 1-32.
"A Little Review of Domain Adaptation in 2017", github, Retrieved on May 28, 2020, Webpage available at : https://artix41.github.io/static/domain-adaptation-in-2017/index.html#fn6.
Cheng et al., "Wasserstein Distance Based Deep Adversarial Transfer Learning for Intelligent Fault Diagnosis", arXiv, Mar. 2, 2019, pp. 1-11.
You et al., "Towards Accurate Model Selection in Deep Unsupervised Domain Adaptation", Proceedings of the 36th International Conference on Machine Learning, 2019, 10 pages.
Cui et al., "Self-adaptation for Unsupervised Domain Adaptation", Proceedings of the International Conference on Recent Advances in Natural Language Processing (RANLP), Sep. 2019, pp. 213-222.
Shen et al., "Wasserstein Distance Guided Representation Learning for Domain Adaptation", The Thirty-Second AAAI Conference on Artificial Intelligence, 2018, pp. 4058-4065.
Tzeng et al., "Simultaneous Deep Transfer Across Domains and Tasks", arXiv, Oct. 8, 2015, 9 pages.
Office action received for corresponding Finnish U.S. Appl. No. 20/195,817, dated Jan. 24, 2020, 8 pages.
"Use Cases and Requirements for Compressed Representation of Neural Networks", ISO/IEC JTC1/SC29/WG11/N17509, Requirements Subgroup, Apr. 2018, 33 pages.
"Extended European Search Report received for corresponding European Patent Application No. 20186401.4, dated Feb. 24, 2021, 8 pages."
Phong et al., "Privacy-Preserving Deep Learning via Weight Transmission", IEEE Transactions on Information Forensics and Security , dated Feb. 12, 2019, pp. 1-23.
Liu et al., "Secure Federated Transfer Learning", Arxiv, dated Dec. 8, 2018, 9 pages.

* cited by examiner

DOMAIN ADAPTATION

FIELD

The present specification relates to domain adaptation.

BACKGROUND

Encoders may be trained using labelled training data (for example using the principles of machine learning). If data applied to such an encoder during a training phase has similar properties to data applied during a deployment phase, then high performing encoders can be provided. This is not always the case in real-world systems. There remains a need for further developments in this field.

SUMMARY

In a first aspect, this specification provides an apparatus comprising: means for initialising weights of a target encoder based on a source encoder, wherein the source encoder implements a first algorithm; means for initialising weights of a target discriminator associated with the target encoder such that the target discriminator is initialised to match a source discriminator associated with the source encoder; means for applying some of a target data set (e.g. comprising unlabeled or partially labelled data) to the target encoder to generate target encoder outputs; means for applying the target encoder outputs to the target discriminator to generate a first local loss function output; means for training the target encoder to seek to increase the first local loss function output; means for training the target discriminator to seek to decrease the first local loss function output; and means for synchronising weights of the target discriminator and the source discriminator following said training of said target discriminator and corresponding training of said source discriminator. The training of the source discriminator may be in response to the application of source data to the source encoder to generate source encoder outputs, which are applied to the source discriminator to generate a second local loss function, which is used to train the source discriminator (e.g. to seek to decrease the second local loss function). The first algorithm may be trained based on labelled data. The target encoder may seek to implement a variant of this first algorithm.

The said source encoder may be fixed (e.g. not updated during the training process described herein).

In some example embodiments, the means for synchronising said weights of the target discriminator and the source discriminator synchronises said weights following a plurality of instances (e.g. a pre-defined number of instances) of training of said target discriminator and said corresponding training of said source discriminator.

The means for training the target encoder may comprise means for updating said weights (e.g. on each iteration/each application of target data). The means for training the target discriminator may comprise means for updating said weights of said target discriminator.

In some example embodiments, the means for synchronising weights of the target discriminator and the source discriminator comprises means for averaging the weights (e.g. using a moving average) of the target and source discriminators. Alternatively, or in addition, the means for synchronising weights of the target discriminator and the source discriminator may comprise means for averaging (e.g. using a moving average) changes to the weights of the target and source discriminators.

The means for training the target encoder comprises means for updating said weights (e.g. on each iteration/each application of target data) of said target encoder. Moreover, the means for training the target discriminator may comprises means for accumulating desired changes to said weights of said target discriminator. The means for synchronising weights of the target discriminator and the source discriminator may comprise means for averaging accumulated desired changes to the weights of the target and source discriminators (e.g. using a moving average).

In some example embodiments, the means for initialising weights of the target discriminator initialises the weights of the target discriminator randomly, pseudo-randomly or arbitrarily. The source discriminator may be similarly initialised.

The means for initialising weights of the target encoder may set the weights of the target encoder to be identical to corresponding weights of the source encoder.

In some example embodiments, the target encoder is implemented using a neural network, wherein said weights of said target encoder are weights of said neural network. Further, the means for initialising said target encoder may comprise means for receiving weights of a source encoder neural network at said target encoder.

In some example embodiments, the target discriminator is implemented using a neural network, wherein said weights of said target discriminator are weights of said neural network. The source discriminator may also be implemented using a numeral network. Initialising the target discriminator may comprise providing weights of the source discriminator to the target discriminator (or vice-versa).

Some example embodiments further comprise means for selecting an initial instance of the source encoder from a plurality of candidate encoders. The means for selecting the initial instance of the source encoder may select an optimum source encoder from the plurality of candidate encoders according to some metric. The said metric may be related to a divergence (e.g. a computing domain divergence) between domains. Thus, the source encoder may be selected based on the candidate encoder that shows the smallest divergence between domains, according to the chosen metric (i.e. the smallest difference between the domain of the candidate and the domain of the source).

The said means may comprise: at least one processor; and at least one memory including computer program code, the at least one memory and the computer program configured, with the at least one processor, to cause the performance of the apparatus.

In a second aspect, this specification provides a system comprising: means for initialising weights of a target encoder based on a source encoder, wherein the source encoder implemented a first algorithm; means for initialising weights of a target discriminator, associated with the target encoder, and weights of a source discriminator, associated with the source encoder, such that the target and source discriminators match; means for applying some of a target data set to the target encoder to generate target encoder outputs; means for applying some of a source data set to the source encoder to generate source encoder outputs; means for applying the target encoder outputs to the target discriminator to generate a first local loss function; means for applying the source encoder outputs to the source discriminator to generate a second local loss function; means for training the target encoder to seek to increase the first local loss function output; means for training the target discriminator to seek to decrease the first local loss function output; means for training the source discriminator to seek to decrease the second local loss function output; and means for synchronising weights of the target discriminator and the source discriminator following said training of said target discriminator and said source discriminator. The said source encoder may be fixed (e.g. not updated during the training process described herein).

The system of the second aspect may further comprise one or more of the features described above with reference to the apparatus of the first aspect.

In a third aspect, this specification describes a method comprising: initialising weights of a target encoder based on a source encoder, wherein the source encoder implements a first algorithm; initialising weights of a target discriminator associated with the target encoder such that the target discriminator is initialised to match a source discriminator associated with the source encoder; applying some of a target data set to the target encoder to generate target encoder outputs; applying the target encoder outputs to the target discriminator to generate a first local loss function output; training the target encoder to seek to increase the first local loss function output; training the target discriminator to seek to decrease the first local loss function output; and synchronising weights of the target discriminator and the source discriminator following said training of said target discriminator and corresponding training of said source discriminator.

The training of the source discriminator may be in response to the application of source data to the source encoder to generate source encoder outputs, which are applied to the source discriminator to generate a second local loss function, which is used to train the source discriminator (e.g. to seek to decrease the second local loss function). The first algorithm may be trained based on labelled data.

The target encoder may seek to implement a variant of this first algorithm.

The said source encoder may be fixed (e.g. not updated during the training process described herein).

In some example embodiments, synchronising said weights of the target discriminator and the source discriminator synchronises said weights following a plurality of instances (e.g. a pre-defined number of instances) of training of said target discriminator and said corresponding training of said source discriminator.

Training the target encoder may comprise updating said weights (e.g. on each iteration/each application of target data). Training the target discriminator may comprise updating said weights of said target discriminator.

In some example embodiments, synchronising weights of the target discriminator and the source discriminator comprises averaging the weights (e.g. using a moving average) of the target and source discriminators. Alternatively, or in addition, synchronising weights of the target discriminator and the source discriminator may comprise averaging (e.g. using a moving average) changes to the weights of the target and source discriminators.

Training the target encoder may comprise updating said weights (e.g. on each iteration/each application of target data) of said target encoder. Moreover, training the target discriminator may comprises accumulating desired changes to said weights of said target discriminator. Synchronising weights of the target discriminator and the source discriminator may comprise averaging accumulated desired changes to the weights of the target and source discriminators (e.g. using a moving average).

Some example embodiments further comprise selecting an initial instance of the source encoder from a plurality of candidate encoders. Selecting the initial instance of the source encoder may select an optimum source encoder from the plurality of candidate encoders according to some metric.

In a fourth aspect, this specification provides a method comprising: initialising weights of a target encoder based on a source encoder, wherein the source encoder implemented a first algorithm; initialising weights of a target discriminator, associated with the target encoder, and weights of a source discriminator, associated with the source encoder, such that the target and source discriminators match; applying some of a target data set to the target encoder to generate target encoder outputs; applying some of a source data set to the source encoder to generate source encoder outputs; applying the target encoder outputs to the target discriminator to generate a first local loss function; applying the source encoder outputs to the source discriminator to generate a second local loss function; training the target encoder to seek to increase the first local loss function output; training the target discriminator to seek to decrease the first local loss function output; training the source discriminator to seek to decrease the second local loss function output; and synchronising weights of the target discriminator and the source discriminator following said training of said target discriminator and said source discriminator. The said source encoder may be fixed (e.g. not updated during the training process described herein).

The method of the fourth aspect may further comprise one or more of the features described above with reference to the method of the third aspect.

In a fifth aspect, this specification describes an apparatus configured to perform any method as described with reference to the third or fourth aspects.

In a sixth aspect, this specification describes computer-readable instructions which, when executed by computing apparatus, cause the computing apparatus to perform any method as described with reference to the third or fourth aspects.

In a seventh aspect, this specification describes a computer program comprising instructions for causing an apparatus to perform at least the following: initialising weights of a target encoder based on a source encoder, wherein the source encoder implements a first algorithm; initialising weights of a target discriminator associated with the target encoder such that the target discriminator is initialised to match a source discriminator associated with the source encoder; applying some of a target data set to the target encoder to generate target encoder outputs; applying the target encoder outputs to the target discriminator to generate a first local loss function output; training the target encoder to seek to increase the first local loss function output; training the target discriminator to seek to decrease the first local loss function output; and synchronising weights of the target discriminator and the source discriminator following said training of said target discriminator and corresponding training of said source discriminator.

In an eighth aspect, this specification describes a computer-readable medium (such as a non-transitory computer-readable medium) comprising program instructions stored thereon for performing at least the following: initialising weights of a target encoder based on a source encoder, wherein the source encoder implements a first algorithm; initialising weights of a target discriminator associated with the target encoder such that the target discriminator is initialised to match a source discriminator associated with the source encoder; applying some of a target data set to the target encoder to generate target encoder outputs; applying the target encoder outputs to the target discriminator to generate a first local loss function output; training the target encoder to seek to increase the first local loss function output; training the target discriminator to seek to decrease the first local loss function output; and synchronising weights of the target discriminator and the source discriminator following said training of said target discriminator and corresponding training of said source discriminator.

In a ninth aspect, this specification describes an apparatus comprising: at least one processor; and at least one memory including computer program code which, when executed by the at least one processor, causes the apparatus to: initialise weights of a target encoder based on a source encoder, wherein the source encoder implements a first algorithm; initialise weights of a target discriminator associated with the target encoder such that the target discriminator is initialised to match a source discriminator associated with the source encoder; apply some of a target data set to the target encoder to generate target encoder outputs; apply the target encoder outputs to the target discriminator to generate a first local loss function output; train the target encoder to seek to increase the first local loss function output; train the target discriminator to seek to decrease the first local loss function output; and synchronise weights of the target discriminator and the source discriminator following said training of said target discriminator and corresponding training of said source discriminator.

In an tenth aspect, this specification describes an apparatus comprising: a first initialisation module for initialising weights of a target encoder based on a source encoder, wherein the source encoder implements a first algorithm; a second initialisation module for initialising weights of a target discriminator associated with the target encoder such that the target discriminator is initialised to match a source discriminator associated with the source encoder; a first input for applying some of a target data set (e.g. comprising unlabeled or partially labelled data) to the target encoder to generate target encoder outputs, wherein the target discriminator generates a first local loss function output based on the generated target encoder outputs; a first training module (for example using machine learning principles) for training the target encoder to seek to increase the first local loss function output; a second training module (for example using machine learning principles) for training the target discriminator to seek to decrease the first local loss function output; and a control module for synchronising weights of the target discriminator and the source discriminator following said training of said target discriminator and corresponding training of said source discriminator.

BRIEF DESCRIPTION OF THE DRAWINGS

Example embodiments will now be described, by way of non-limiting examples, with reference to the following schematic drawings, in which.

DETAILED DESCRIPTION

Figure 1A:
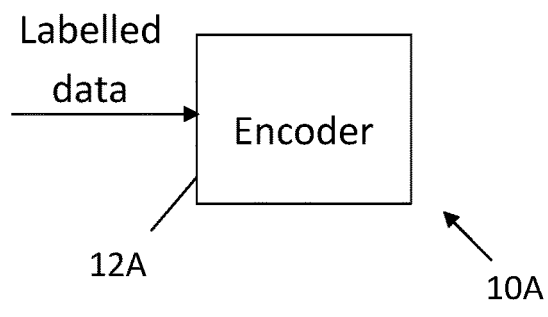
FIG. 1A is a block diagram of an example system.

The scope of protection sought for various example embodiments of the invention is set out by the independent claims. The example embodiments and features, if any, described in the specification that do not fall under the scope of the independent claims are to be interpreted as examples useful for understanding various example embodiments of the invention.

In the description and drawings, like reference numerals refer to like elements throughout.

FIG. 1A is a block diagram of an example system, indicated generally by the reference numeral 10A. The system 10A comprises an encoder 12A having an input that is receiving labelled data. The labelled data is used for training the encoder 12A using machine-learning principles, as discussed further below.

Figure 1B:
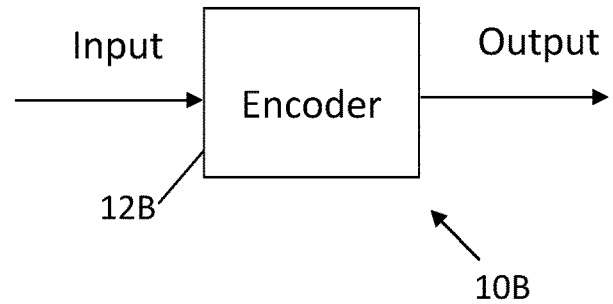
FIG. 1B is a block diagram of an example system.

FIG. 1B is a block diagram of an example system, indicated generally by the reference numeral 10B. The system 10B comprises an encoder 12B that is a trained version of the encoder 12A (e.g. trained using the labelled data of FIG. 1A). The encoder 12B receives an input and generates an output based on the trained function of the encoder.

Machine Learning (ML) algorithms, as data-driven computational methods, typically attempt to fit a complicated function over a labelled dataset (e.g. a set of training data), with the expectation that comparable performance will be achieved when an unseen dataset (e.g. testing data or operational data) is applied to the trained algorithm. Such training algorithms may be referred to as supervised learning algorithms in which a labelled training set is used to learn a mapping between input data and class labels.

In both theory and practice, machine learning and supervised learning methodologies typically assume that the data distributions of training datasets and deployment (e.g. testing) datasets are the same.

Thus, in the example systems 10A and 10B, it may be assumed that the distribution of the input data of the system 10B matches the distribution of the labelled data in the system 10A.

Following this assumption, labelled training sets may be provided for each of a plurality of data distributions, even though many of these data distributions may be similar. Example sets of data for which separate labelled training data might be generated include images of the same object from different angles, paintings in different styles, human activity sensors in different body locations, processing of the same language with different accents and so on.

In real-world systems, the assumption that the data distributions of training datasets and deployment (e.g. testing) datasets are the same is not always valid. A number of real-world factors may lead to variability between training and operational (or test) data distributions. These factors could include, for example, variabilities induced by sensor processing pipelines, or by environment factors (e.g., lighting conditions), or by user-related issues (e.g., different people wear their smart devices differently, thereby causing a shift in the distribution of the generated data). This shift in data distribution between training domains and testing/deployment domains is sometimes referred to as "domain shift".

As discussed further below, "domain adaptation" seeks to address the issue of domain shift. In general, domain adaptation provides two similar (but different) domains, referred to herein as a source domain and a target domain Data instances in the source domain are typically labelled (providing labelled training data for a source model), whereas data instances in the target domain are partially labelled (semi-supervised domain adaption) or not labelled at all (unsupervised domain adaption). The aim of domain adaption is to seek to train a target model by utilizing aspects of the source model.

Thus, instead of training each data distribution (or "domain") from scratch, domain adaptation seeks to develop a target model by adapting a source model. This can lead to a reduction in labelling efforts and, in some circumstances, to the development of more robust models.

Figure 2:
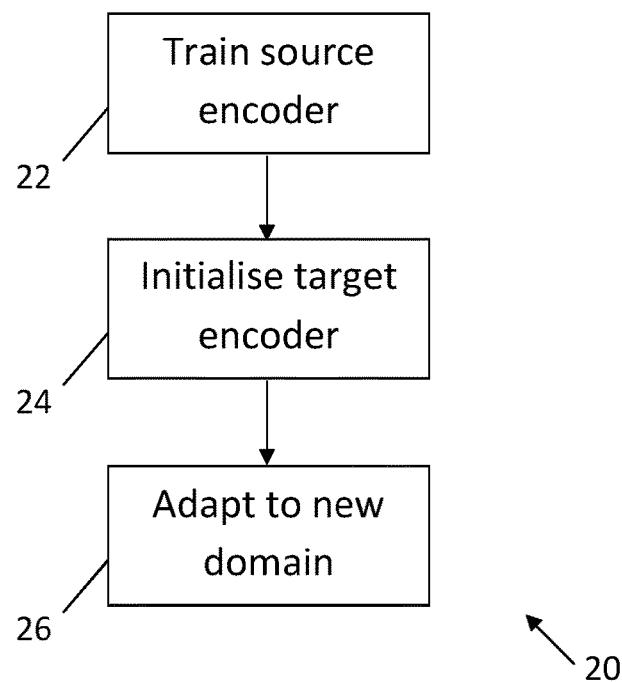
FIG. 2 is a flow chart showing an algorithm in accordance with an example embodiment.

FIG. 2 is a flow chart showing an algorithm, indicated generally by the reference numeral 20, in accordance with an example embodiment. The algorithm 20 shows an example domain adaptation algorithm.

The algorithm 20 starts at operation 22, where a source encoder is trained. The source encoder may, for example, be trained using labelled training data (as described above with reference to FIG. 1A), for example, by any artificial neural network model, such as a convolutional neural network (CNN).

At operation 24, a target encoder is initialised. For example, the target encoder may be initialised to be identical to the trained source encoder, although this is not essential to all example embodiments. In some implementations, the entity managing the trained source encoder may transmit a copy of the trained source encoder to the target domain.

At operation 26, the initialised target encoder is adapted to the new domain (thereby completing the domain adaptation process). For example adversarial domain adaptation techniques may be used. Example arrangements for adapting the target encoder to the new domain are described in detail below.

Figure 3:
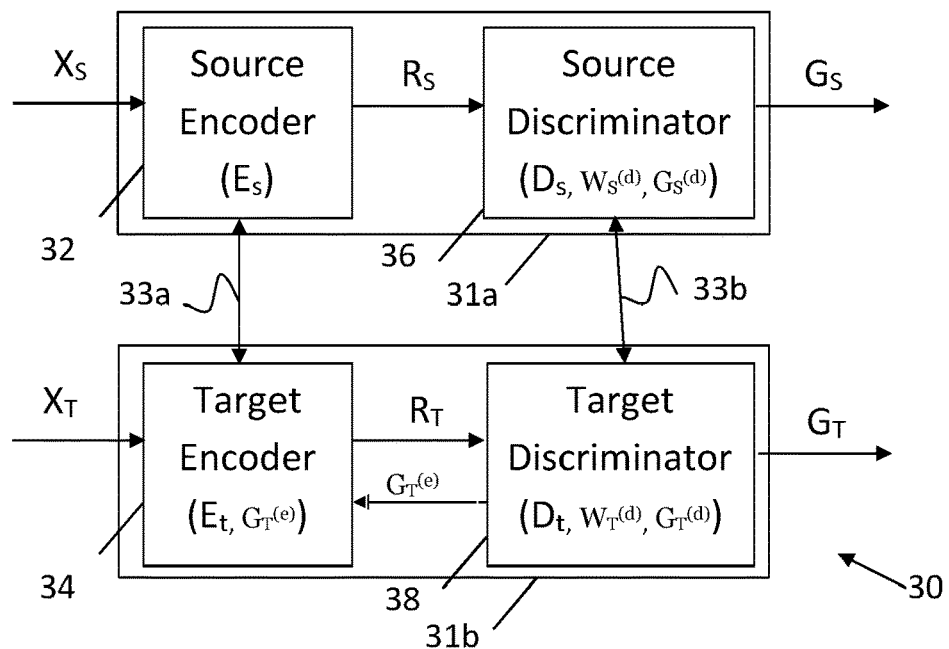
FIG. 3 is a block diagram of a system in accordance with an example embodiment.

FIG. 3 is a block diagram of a system, indicated generally by the reference numeral 30, in accordance with an example embodiment. The system 30 comprises a source encoder 32, a target encoder 34, a source discriminator 36 and a target discriminator 38. The source encoder 32 and the source discriminator 36 form part of a source node or domain 31a. The target encoder 34 and the target discriminator 38 form part of a target node or domain 31b. A first communications link 33a may be provided between the source encoder 32 and the target encoder 34. A second communications link 33b may be provided between the source discriminator 36 and the target discriminator 38.

Assume that the source dataset $X_S$ (or part thereof) is provided to the source encoder 32 and a target dataset $X_T$ (or part thereof) is provided to the target encoder 34. These datasets may reside on different nodes (such as machines, apparatuses, devices, servers, and the like) and do not need to be shared with each other, thereby addressing challenges associated with user privacy. In this way, the system 30 can provide an adversarial domain adaptation system in which the source domain (comprising the source encoder 32 and the source discriminator 36) may be separated, physically or logically, from the target domain (comprising the target encoder 34 and the target discriminator 36), for example at a source node 31a and a target node 31b respectively. Thus, the system 30 enables a distributed system to be provided.

Figure 4:
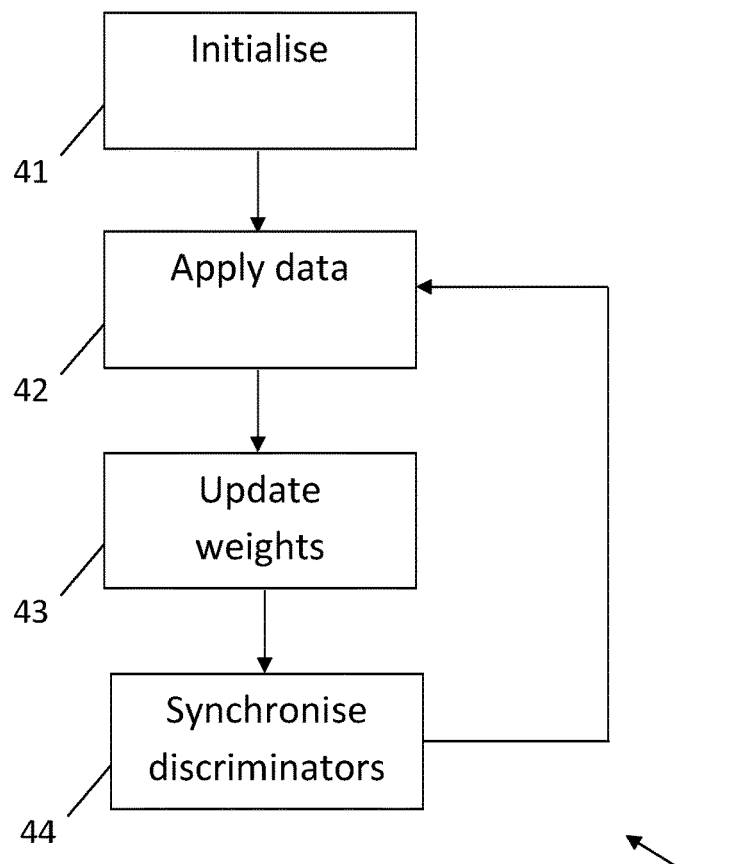
FIGS. 4 to 8 are flow charts showing algorithms in accordance with example embodiments.

FIG. 4 is a flow chart showing an algorithm, indicated generally by the reference numeral 40, in accordance with an example embodiment. As discussed below, the algorithm 40 may be used in the training of the target encoder 34.

The algorithm 40 starts at operation 41, where the elements of the system 30 are initialised. A source domain starts with a pre-trained source encoder 32 having a function $E_S$ and randomly initialized source discriminator 36 having a function $D_S$; a target domain starts with the target encoder 34 having a function $E_T$ and target discriminator 38 having a function $D_T$.

The target encoder 34 and the target discriminator 38 are initialized (at operation 41) by the source node. Thus, for example, the target encoder 34 may be initialised to be identical to the pre-trained source encoder 32 and the target discriminator 38 may be initialised to be identical to the initialised (e.g. both randomly initialised) source discriminator 36. In some implementations, the target node 31b may request the initialization and/or information of the target encoder 34 and the target discriminator 38 from the source node 31a (for example using one or more of the communications links 33a and 33b).

At operation 42 of the algorithm 40, data is applied to the source encoder 32 and the target encoder 34. More specifically, the source encoder 32 samples a batch of the source dataset $X_S$ to obtain feature representations $R_S$ and the target encoder 34 samples a batch of the target dataset $X_T$ to obtain feature representations $R_T$. The feature representations $R_S$ are provided to the source discriminator 36, which source discriminator may be a neural network having weights $W_S^{(d)}$ Similarly, the feature representations $R_T$ are provided to the target discriminator 38, which target discriminator may be a neural network having weights $W_T^{(d)}$. ($W_S^{(d)}$ and $W_T^{(d)}$ may represent the weights of neural networks corresponding to $D_S$ and $D_T$).

Based on a pre-defined loss function (e.g. a cross-entropy loss), the gradients of the loss with respect to the parameters of the neural networks can be determined. Thus, the gradients $G_S^{(d)}$, $G_T^{(d)}$ and $G_T^{(e)}$ of the source discriminator 36, the target discriminator 38 and the target encoder 34 respectively can be determined.

At operation 43, the relevant weights $W_S^{(d)}$ and $W_T^{(d)}$ are updated. As described further below, in accordance with adversarial training principles, the source and target discriminators 36 and 38 are trained to minimise the respective loss functions La of those discriminators and the target encoder 34 is trained to maximise the loss function La. The pre-trained source encoder 32 is not further trained. $D_S$, $D_T$ and $E_T$ will be updated in the adaptation process while $E_S$ is pre-trained and fixed.

At operation 44, the discriminators 36 and 38 are synchronised, as discussed further below.

With the relevant weights updated and synchronised, the operations 42 to 44 are repeated. When the algorithm is complete (e.g. after a defined number of iterations or data batches, or when a defined performance level is achieved), a final value (e.g. an optimal value) of $E_T$ is generated, which can be used as the encoder model of the target domain.

Figure 5:
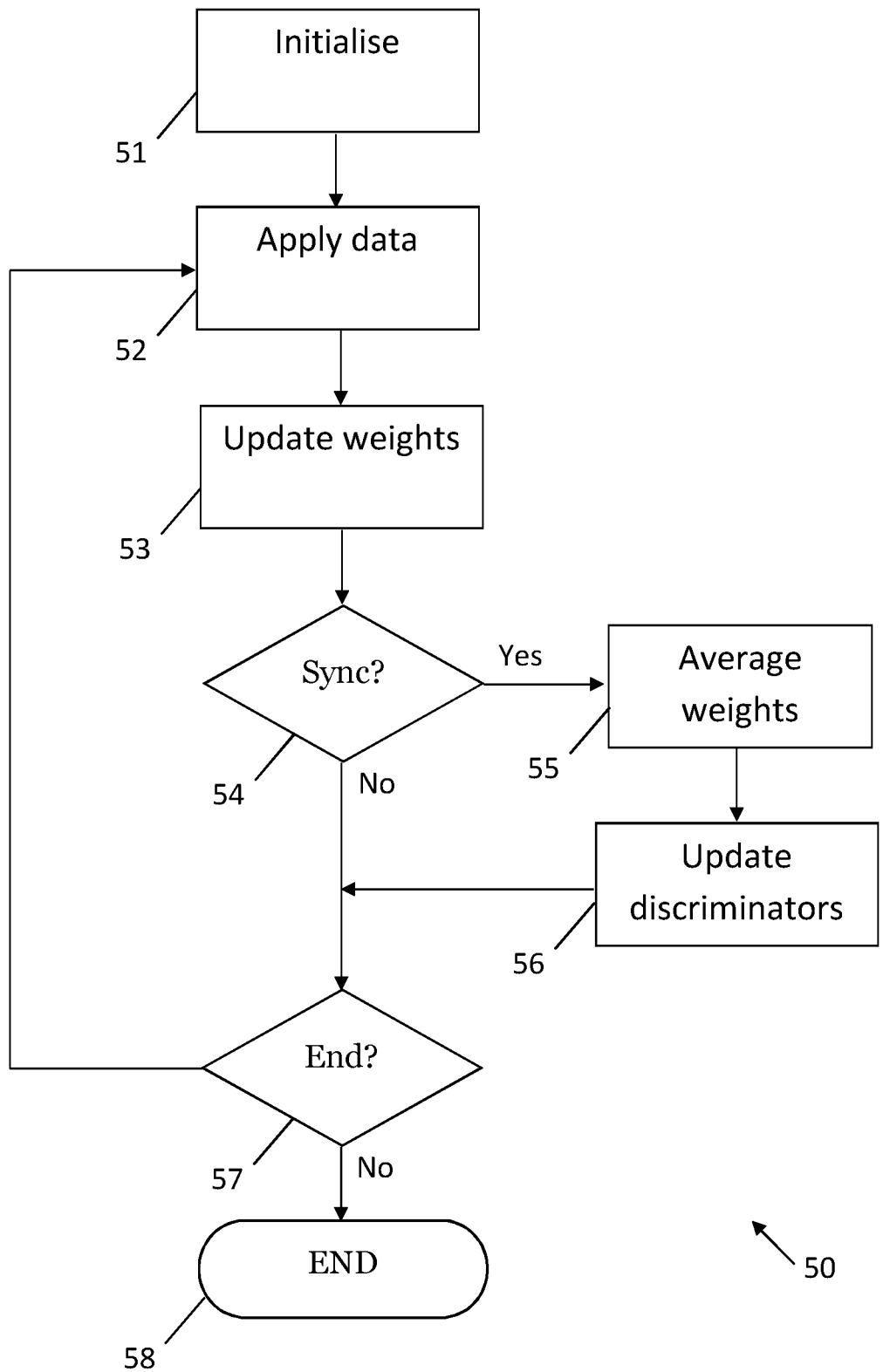
Figure 6:
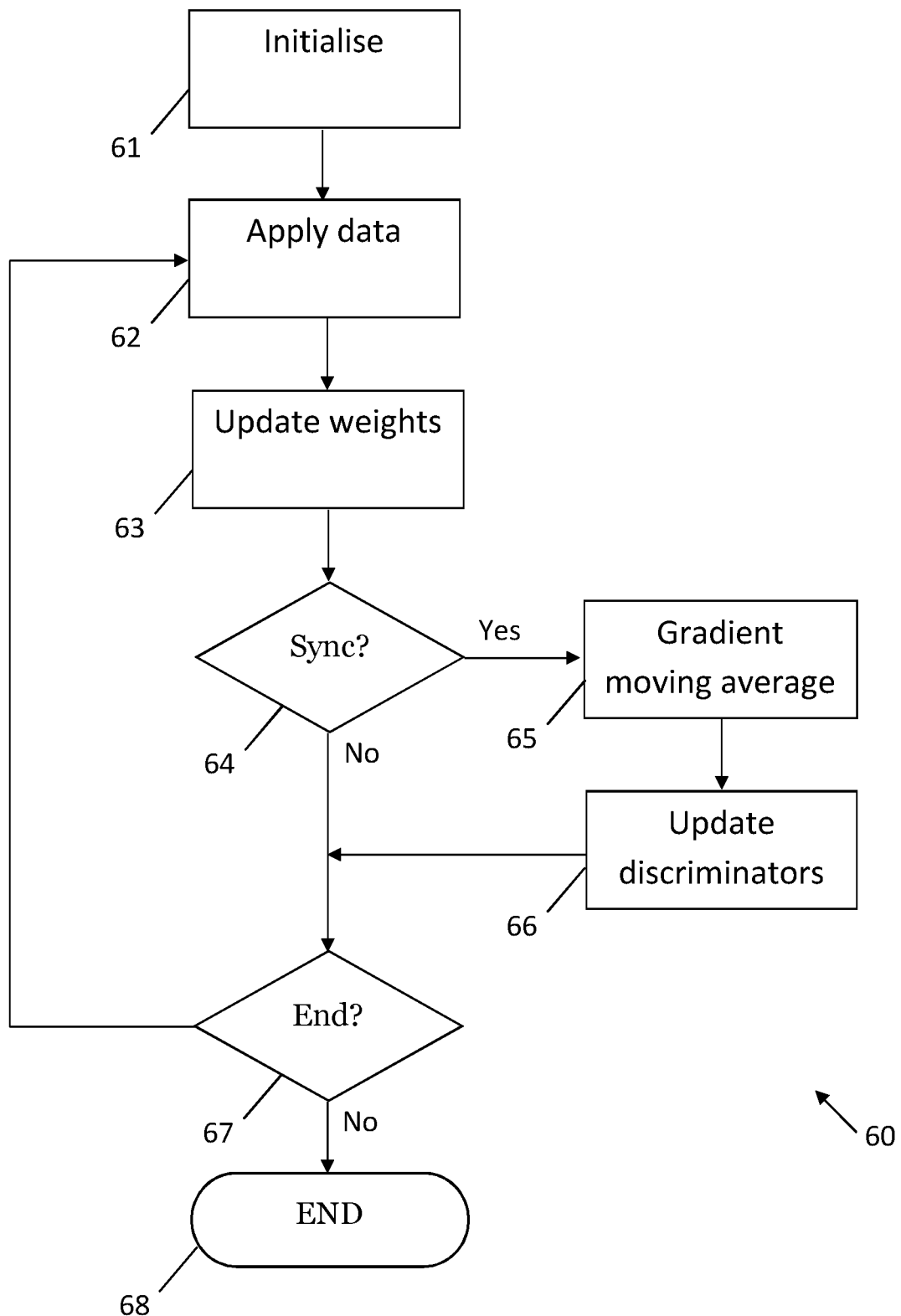
Figure 7:
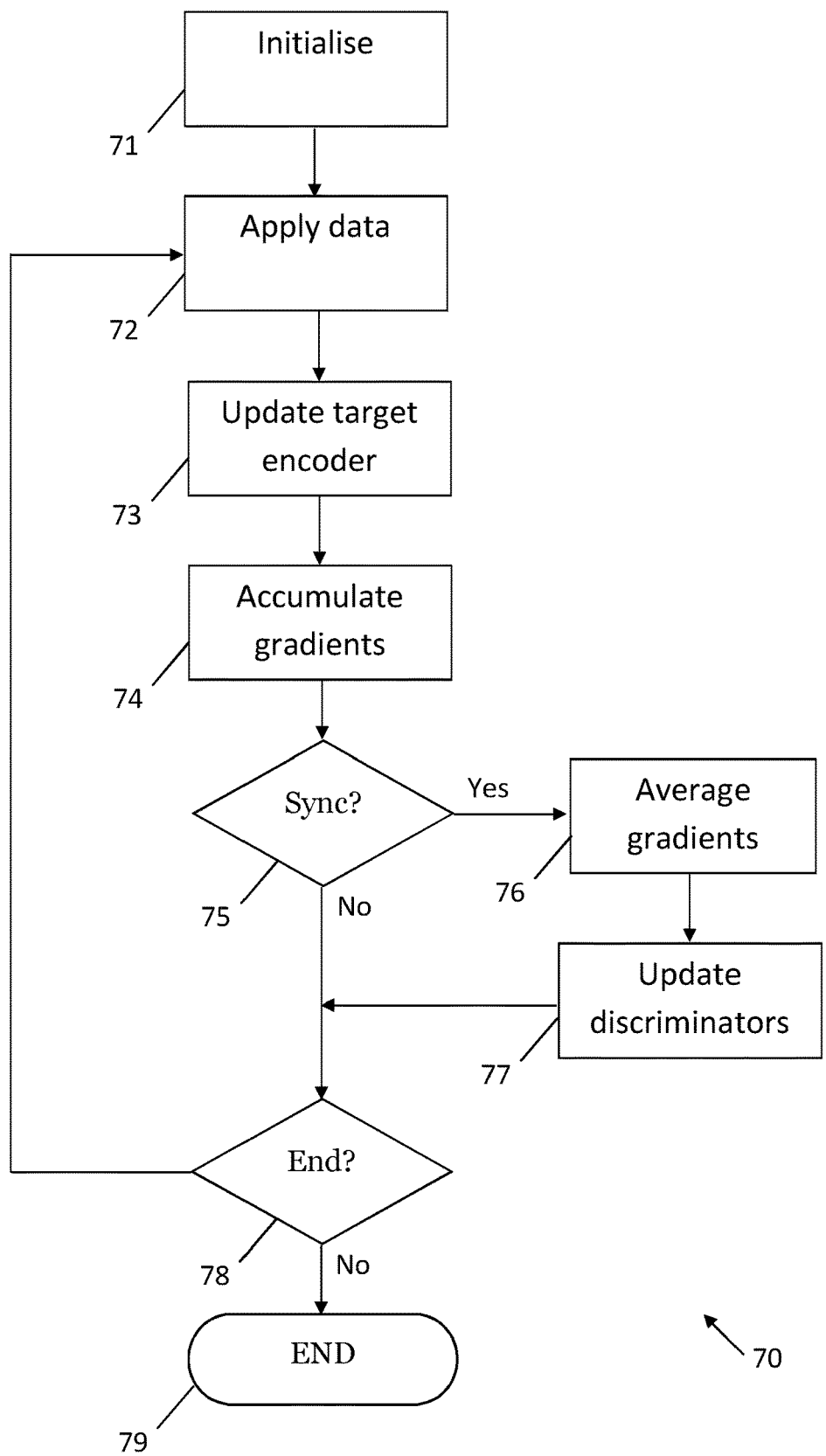

FIGS. 5 to 7 are flow charts showing three algorithms that provide example implementations of the algorithm 40 described above with reference to FIG. 4.

FIG. 5 is a flow chart showing an algorithm, indicated generally by the reference numeral 50, in accordance with an example embodiment.

The algorithm 50 starts at operation 51, where as described above, the elements of the system 30 are initialised. Thus, in common with the operation 41 of the algorithm 40, the target encoder 34 is initialised to be identical to the pre-trained source encoder 32 and the target discriminator 38 is initialised to be identical to the initialised (e.g. randomly initialised) source discriminator 36.

At operation 52 of the algorithm 50, data is applied to the source encoder 32 and the target encoder 34. In common with operation 42 of the algorithm 40, the source encoder 32 samples a batch of the source dataset $X_S$ to obtain feature representations $R_S$ and the target encoder 34 sample a batch of the target dataset $X_T$ to obtain feature representations $R_T$.

At operation 53, the relevant weights are updated. As described above with reference to the algorithm 40, the source and target discriminators 36 and 38 are trained to minimise the respective loss functions La of those discriminators and the target encoder 34 is trained to maximise the loss function La. The source discriminator function $D_S$ and the target discriminator function $D_T$ (which are separately updated) may be updated based on an average (e.g. a moving average) of recent weights at the respective discriminator.

At operation 54, it is determined whether the current iteration of the algorithm 50 is a synchronisation step. If so, the algorithm 50 moves to operation 55; otherwise, the algorithm 50 moves to operation 57. As discussed further below, since the source and target discriminators may be provided in separate domains, data transfer costs can be reduced by enabling the discriminators to be updated locally for a number of iterations, before being synchronised.

The triggering of the synchornisation operation may be a user-defined parameter (for example, a user defined number of iterations of the operations 52 and 53 may be implemented before the algorithm moves from operation 54 to operation 55). A number of considerations are relevant when considering such parameters, including data transfer costs, as noted above.

At operation 55, the weights of the discriminator $D_S$ and $D_T$ (i.e. the weights $W_S^{(d)}$ and $W_T^{(d)}$) are averaged so that an average change in those weights over the iterations since the last synchronisation step is determined. Then, at operation 56, the source discriminator and the target discriminator are both updated based on the averaging of the weights in the operation 55. In this way, the discriminator weights $W_S^{(d)}$ and $W_T^{(d)}$ (which may have diverged following a number of iterations of the algorithm 50 without synchronisation) are equalised.

The synchronisation of the discriminators may be symmetric such that data exchange could, in principle, happen in either direction, wherein the "receiving domain" performs the averaging operation 55 and sends the averaged values back to the sending domain to enable the discriminators to be updated in operation 56.

Following the operation 56, the algorithm 50 moves to operation 57.

At operation 57, a determination is made regarding whether the algorithm 50 is complete (e.g. after a defined number of batch iterations, or when a defined performance level is achieved). If so, the algorithm 50 terminates at operation 58; otherwise, the algorithm returns to operation 52 and further data is applied such that the source and target discriminators and the target encoder can be further updated. As noted above, when the algorithm terminates (at operation 58), a final value (e.g. an optimal value) of $E_T$ is generated, which can be used as the encoder model of the target domain.

FIG. 6 is a flow chart showing an algorithm, indicated generally by the reference numeral 60, in accordance with an example embodiment. The algorithm 60 is a variant of the algorithm 50 described above.

The algorithm 60 starts at operation 61, where, as described above, the elements of the system 30 are initialised (e.g. by initialising the target encoder 34 to be identical to the pre-trained source encoder 32 and initialising the target discriminator 38 to be identical to the initialised source discriminator 36).

At operation 62 of the algorithm 60, data is applied to the source encoder 32 and the target encoder 34. In common with operations 42 and 52 described above, the source encoder 32 samples a batch of the source dataset $X_S$ to obtain feature representations $R_S$ and the target encoder 34 samples a batch of the target dataset $X_T$ to obtain feature representations $R_T$.

At operation 63, the relevant weights are updated. As described above, the source and target discriminators 36 and 38 are trained to minimise the respective loss functions La of those discriminators and the target encoder 34 is trained to maximise the loss function La. The source discriminator function $D_S$ and the target discriminator function $D_T$ (which are separately updated) may be updated based on an average (e.g. a moving average) of recent weights at the respective discriminator.

At operation 64, it is determined whether the current iteration of the algorithm 60 is a synchronisation step (e.g. based on user-defined parameters as described above). If so, the algorithm 60 moves to operation 65; otherwise, the algorithm 60 moves to operation 67. Since the source and target discriminators may be provided in separate domains, data transfer costs can be reduced by enabling the discriminators to be updated locally for a number of iterations, before being synchronised.

At operation 65, the gradients of the discriminator $D_S$ and $D_T$ are averaged so that an average change over the iterations since the last synchronisation step is determined. The operation 65 therefore differs from the operation 55 in that gradients are considered (rather than the weights themselves). Moreover, the operation 65 may consider a moving average of gradients. Then, at operation 66, the source discriminator and the target discriminator are both updated based on the gradient moving average in the operation 65. In this way, the discriminator weights $W_S^{(d)}$ and $W_T^{(d)}$ (which may have diverged following a number of iterations of the algorithm 50 without synchronisation) are equalised. Following the operation 66, the algorithm 60 moves to operation 67.

The moving average function used in the operations 65 and 66 in the synchronisation of the source and target discriminators acts as a filter, such that changes to the source and/or the target discriminator during synchronisation are generally less severe. This can, in some circumstances, improve performance. For example, the moving average functions may prevent the source and target discriminators from diverging too much from one another.

At operation 67, a determination is made regarding whether the algorithm 60 is complete (e.g. after a defined number of batch iterations, or when a defined performance level is achieved). If so, the algorithm 60 terminates at operation 68; otherwise, the algorithm returns to operation 62 and further data is applied such that the source and target discriminators and the target encoder can be further updated. As noted above, when the algorithm terminates (at operation 68), a final value (e.g. an optimal value) of $E_T$ is generated, which can be used as the encoder model of the target domain.

FIG. 7 is a flow chart showing an algorithm, indicated generally by the reference numeral 70, in accordance with an example embodiment. The algorithm 70 is a variant of the algorithms 50 and 60 described above.

The algorithm 70 starts at operation 71, where, as described above, the elements of the system 30 are initialised (e.g. by initialising the target encoder 34 to be identical to the pre-trained source encoder 32 and initialising the target discriminator 38 to be identical to the initialised source discriminator 36).

At operation 72 of the algorithm 70, data is applied to the source encoder 32 and the target encoder 34. In common with operations 42, 52 and 62 described above, the source encoder 32 samples a batch of the source dataset $X_S$ to obtain feature representations $R_S$ and the target encoder 34 sample a batch of the target dataset $X_T$ to obtain feature representations $R_T$.

At operation 73, the weights of the target encoder 34 are updated. The weights of the source and target discriminators 36 and 38 are not updated at this stage. Rather, at operation 74, the gradients generated locally for updating the discriminators are accumulated for use later in the algorithm.

At operation 75, it is determined whether the current iteration of the algorithm 70 is a synchronisation step (e.g. based on user-defined parameters as described above). If so, the algorithm 70 moves to operation 76; otherwise, the algorithm 70 moves to operation 78. Since the source and target discriminators may be provided in separate domains, data transfer costs can be reduced by enabling the discriminator gradients to be accumulated locally for a number of iterations, before synchronisation occurs.

At operation 76, the gradients accumulated in multiple iterations of the operation 74 are averaged so that an average change of the discriminator functions $D_S$ and $D_T$ over the iterations since the last synchronisation step is determined. Then, at operation 77, the source discriminator and the target discriminator are both updated based on the averaging of the accumulated gradients in the operation 77. The discriminator weights $W_S^{(d)}$ and $W_T^{(d)}$ at the last synchronisation operation are updated based on the average of the accumulated gradients and are thereby updated and equalised. Following the operation 77, the algorithm 70 moves to operation 78.

The operations 76 and 77 differ from similar operations described above in the use of accumulated gradients in the synchronisation of the source and target discriminators. This process keeps the source and target discriminators synchronised, as they are updated with the same average gradients, that are accumulated over a number of steps.

At operation 78, a determination is made regarding whether the algorithm 70 is complete (e.g. after a defined number of batch iterations, or when a defined performance level is achieved). If so, the algorithm 70 terminates at operation 79; otherwise, the algorithm returns to operation 72 and further data is applied such that the source and target discriminators and the target encoder can be further updated. As noted above, when the algorithm terminates (at operation 79), a final value (e.g. an optimal value) of $E_T$ is generated, which can be used as the encoder model of the target domain.

Three possible implementations of the algorithm 40 have been described above (i.e. the algorithms 50, 60 and 70. Other variants of the algorithms 50, 60 and 70 are possible, such that other implementations of the algorithm 40 are possible. For example, other empirical measures of gradient average or model average may be developed. For instance, one option could be to send the outputs of the source encoder to the target domain (or vice versa) and then update the discriminators with both the source encoder and target encoder results. This would avoid the need for discriminator synchronisation since information would be exchanged at the level of the encoders.

In general, the information exchange between the nodes can happen at discriminator-level (as in the embodiments described in detail above), or at encoder level or even at raw data level (where, for example, all raw data is sent from source to target).

As discussed in detail above, $D_S$ and $D_T$ are updated to minimize La, whereas $E_T$ is updated to maximize La. Since the gradients of $E_T$ are only related to the target data, there is no data exchange required with the source domain. However, for $D_S$ and $D_T$, each can only get the data from one domain, hence gradients or weights are shared across domains such that the discriminators are trained properly with data from both the source and target domains. By this means, the amount of communication from the whole dataset can be reduced to only the size of discriminator, which may be only a few neural network layers.

Moreover, by adopting this approach, raw data exchange between nodes/domains may be avoided (hence, enhancing user privacy and minimizing the storage needs on each node), and the total communication cost is lowered.

The algorithms described above can be used in a wide range of scenarios, such as image recognition.

For example, in the example system of FIG. 3 consider the following scenario in which developers of the source domain 31*a* in a first country are training an artificial intelligence (AI) model which analyzes a sonogram image from a sonography machine and locates the position of a foetus in the image. Assume that the AI model is trained over hundreds of sonograms obtained from hospitals in the first country and has a 90% accuracy of locating the foetus in an image. Now the source domain comprises, a first country images of foetus (i.e. a source domain 1) and/or a sonogram device A (i.e. a source domain 2).

Now, consider the situation in which the developers would like to deploy this AI model in the target domain 31*b* to hospitals in a second country. Due to differences in the precision of sonogram machines and the methodology applied by the sonographers, it is possible that the sonograms in the target domain 31*b* in the second country may look different from those recorded in the source domain 31*a* in the first country. Now the target domain comprises, a second country specific images of foetus (i.e. a target domain 1) and/or a sonogram device B (i.e. a target domain 2). This is an example of domain shift, which can lead to reduction in accuracy of the pre-trained AI model. To counter this, domain adaptation can be used to modify the first model (e.g. source encoder 32) to develop a second model (e.g. target encoder 34) that is adapted for use on the data obtained in the second country.

Using the system 30, sonograms for the first country can reside in the source domain 31*a* (and may be kept in the first country) and sonograms for the second country can reside in the target domain 31*b* (and may be kept in the second country). Domain adaptation can be performed by exchanging the gradients and/or weights of the source and target discriminators 36 and 38, thereby addressing privacy issues (since sonogram data does not need to be shared) and saving communication costs (since the data transfer required is small).

The algorithms described above can be used in many other scenarios, such as natural language processing (NLP) an/or speech recognition. Now consider a second scenario in which developers of the source domain 31*a* are training a model, e.g. a source encoder 32, that analyses human speech to infer the emotion of the speaker. Assume that this model was trained over thousands of speech samples obtained from smartphone users in a single country, e.g. a source country, and has an 85% accuracy of emotion detection.

Now when this model is shipped to other geographical regions, the model may not perform well, due, for example to variations in accents across population groups. As such, the model may need to be adapted for each population group in each target county. The principles described herein can be used to adapt the trained model for the one or more new domains.

The domain adaptation techniques described above typically work well when there are only two domains in the system. However, there remains a need for scaling in the event that the number of available domains increases.

By way of example, consider the example of the model, e.g. the source encoder 32, described above for recognizing the emotion of a speaker from a given speech segment. Assume that the model is developed by a machine-learning developer in the USA. It is likely that the developer would have collected most of their training data from English speakers in the USA and obtained a good performance for the speech task. Now when this model is deployed to other geographical regions (e.g., China, Germany, Switzerland, India etc.), the variability in user accents would introduce domain shift which will degrade the model accuracy. As such, the developer may seek to adapt the model to these target user populations (e.g. using an unsupervised domain adaption technique).

One approach would be for each target domain 31b to be adapted from the labelled source domain 31a (i.e., US speakers). However, it may not always be optimal to adapt from the original source domain, especially if another domain is present in the system that is closer to the target domain. For example, imagine that the original model (for US speakers, e.g. the source encoder 32) has already been adapted for German speaker (e.g. the target encoder 34). Imagine now that we want to adapt the model for Swiss speakers (i.e. a new target encoder). It may be better to adapt the model for German speakers (rather than adapting the "original" model for US speakers), since there is likely to be a greater similarity between Swiss and German speakers than between Swiss and US speakers. In this case, although the US speakers represent the original source domain, adapting from them could be sub-optimal.

Moreover, adapting each target domain from the original source domain may put significant computational and communication loads on the source machine (especially, if, for example, we expect hundreds of new target domains to appear in the system).

Figure 8:
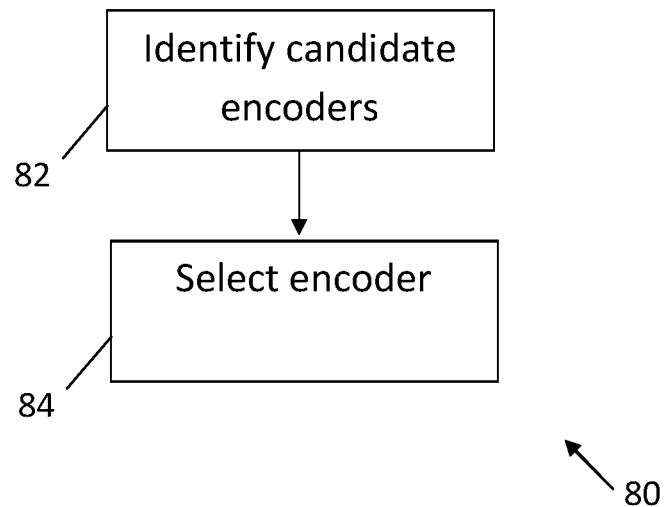

FIG. 8 is a flow chart showing an algorithm, indicated generally by the reference numeral 80, in accordance with an example embodiment. The algorithm 80 enables a target encoder to be initialised based on a source encoder, and then trained.

The algorithm 80 starts at operation 82, where one or more candidate source encoders are identified. Then, at operation 84, a source encoder is selected from the plurality of candidate encoders. The target encoder may then be initialised based on the selected encoder and an encoder adaptation algorithm used to adapt the selected encoder to the target domain (for example, using one of the algorithms described above).

Thus, in the context of the example described above for recognizing the emotion of a speaker from a given speech segment, the plurality of candidate source encoders may include an encoder of the original algorithm (e.g. trained based on US speakers) and other source encoders (e.g. based on Chinese, German, Swiss and Indian speakers) at least some (but not necessarily all) of which may have been modified from the original US algorithm.

Figure 9:
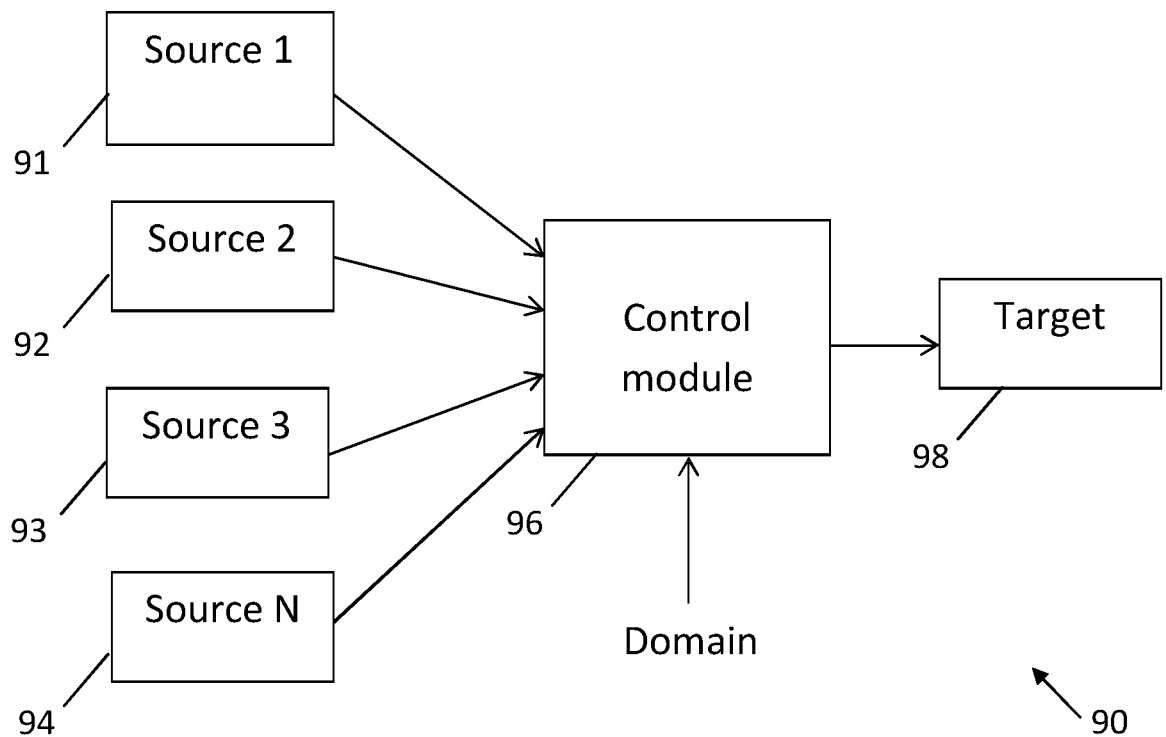
FIG. 9 is a block diagram of a system in accordance with an example embodiment.

FIG. 9 is a block diagram of a system, indicated generally by the reference numeral 90, in accordance with an example embodiment.

The system 90 comprises one or more candidate source encoders, including a first source encoder 91, a second source encoder 92, a third source encoder 93 and an nth source encoder 94. The first source encoder 91 may, for example, be an initial source encoder (such as the US-trained algorithm in the example described above) with one or more of the other source encoders having been modified from that initial source encoder. The source encoders 91 to 94 represent candidate encoders, as discussed above with reference to the operation 82. Clearly, the system 90 may include more or fewer source encoders.

The system 90 further comprises a control module 96 receiving a domain input and information from each of the sources encoders 91 to 94 (such as features extracted from the relevant source encoder or the output of the relevant source encoder when input data from the source domain is passed to the said encoder). The control module determines which of the source encoders is closest to the domain as indicated by the domain input and provides that information to a target encoder 98 (thereby implementing operation 84 of the algorithm 80). As discussed further below, the target encoder 98 may be initialised based on the selected source encoder and then adapted based on the new domain.

The control module 96 may select an optimum source encoder from the one or more candidate encoders according to some metric. As discussed further below, the metric may determine the smallest difference between domains (e.g. a computing domain divergence).

Thus, a collaborative multi-step domain adaption method may be provided, wherein an optimal collaborator is chosen for each new target domain. This approach of performing domain adaptation may result in higher accuracies in the target domain.

At a general level, the system 90 may be used as follows. Assume that we have a labelled source domain S in the system, and we have a classifier ($M_S$) trained using supervised learning algorithms for S. Further, say we have 4 unlabeled target domains in the system (T1, T2, T3, T4), and the goal is to train a classifier for each of these target domains. As we do not have labelled data from the target domains, we will need to perform domain adaptation.

Let us say that T1 is introduced in the system. Currently, we only have S already in the system (e.g. the initial source encoder 91) along with its pre-trained inference model $M_S$. As such, we perform a domain adaptation step between S and T1, which results in a model $M_{T1}$ for the domain T1 (e.g. according to the one or more prosesses 50, 60 or 70 in FIG. 5, 6 or 7).

Now assume that T2 is introduced in the system, which already has S, T1 and their associated model $M_S$ and $M_{T1}$. Although T1 itself is an adapted domain, we can now treat it as a source domain and consider it equivalent to our original labelled source domain S As such, for T2, it now has option to adapt from either S or T1.

In an example embodiment, the control module 96 uses a selection technique based on computing domain divergence, i.e. how far are two domains from each other. In particular, the control module 96 may determine a pairwise divergence ($T_2$, S) or ($T_2$, $T_1$) between the target domain (i e T2) and the candidate domains (S and T1), and identify the pair with the smallest divergence.

Computing domain divergences only from unlabeled data is not trivial. We propose using the loss of a binary classifier trained to separate the two domains as a proxy for domain divergence. More details about this technique are provided below.

Assume in the example above that T1 is found as the closest collaborator for T2. Now we perform a domain adaptation step between T1 and T2, wherein we adapt the weights of $M_{T1}$ to output a model for T2, namely $M_{T2}$. Now if T3 is introduced in the system, the steps above can be repeated in order to select the appropriate candidate encoder for the new domain and eventually train a model $M_{T3}$.

We now discuss several ways of implementing the collaborator selection technique and domain adaptation algorithm described above.

The candidate selection technique may be based on computing divergences or distances between different domains. In an example implementation, Wasserstein Distance is used as a metric to compute the distances between two distributions. Wasserstein Distance, also known as the earth-mover distance, works on the intuition that if each domain is viewed as a unit amount of "dirt" piled on a given metric space M, the Wasserstein Distance is the minimum "cost" of turning one pile into the other, which is assumed to be the amount of dirt that needs to be moved times the mean distance it has to be moved.

To compute the Wasserstein Distance, a binary classifier or a domain discriminator may be trained, wherein all the samples from source domain are labelled as 0 and all samples from target domain are labelled as 1. The loss of this binary classifier is used as a proxy for Wasserstein Distance in our implementation—the higher the loss, the higher the Wasserstein Distance, and the further the two domains are from each other. In this way, we can train pairwise discriminators between a target domain and each of a number of candidate collaborators, and find the collaborator with the least Wasserstein Distance with the target domain. This candidate is used as an optimal collaborator for adaptation.

Note that in other example embodiments, other distance metrics (such as MMD (Maximum Mean Discrepancy), KL Divergence, or Logistic Loss) may be used. The skilled person will be aware of alternative metrics, not discussed herein, that could be used.

The candidate selection algorithm described herein may be used independently of the underlying domain adaptation technique being used. In one example embodiment, Adversarial Discriminative Domain Adaptation (ADDA) is used for performing domain adaptation, but this is not essential to all embodiments.

ADDA uses a pre-trained model in the source domain ($M_S$) and a set of unlabeled datasets $X_S$ and $X_T$ from the source and target domains. ADDA adopts an adversarial training approach which involves training a discriminator D and a feature encoder $M_T$ using adversarial training. The goal of the discriminator is to distinguish the two domains while the goal of the encoder is to fool the discriminator by generating features that are indistinguishable across domains. Both the encoder and discriminator participate in this game, trying to fool each other, and in the process both get better at their respective tasks. More importantly, our encoder $M_T$ may learn to map target domain data into the same feature space as the source encoder, thereby enhancing the inference accuracy in the target domain.

By way of example, the principles described above in the example embodiments may be used and combined for human activity recognition models (e.g. to detect walking, running etc.). Assume that a model is trained on accelerometer and gyroscope data collected from a smartphone placed in a user's thigh pocket. Now when this model is deployed, the model can be used with wearable devices placed on body parts other than the thigh. For instance, the model could be adapted and used in an application on a wrist watch, or in an ear-worn device.

The application of the thigh-trained model to these new body positions is an example of a domain shift.

In accordance with the algorithm 80, when the user uses the model with a new body position, we will first find the optimal collaborator (e.g. the most similar body position for which we already have a trained model) and then perform a domain adaptation step to adapt the existing model to this new body position. Whether the optimal collaborator is the original thigh-trained model, or a different model that was itself adapted from the thigh-trained model, is immaterial. Effectively, with adaptation on just unlabeled data, the original activity recognition model can now work on new body positions, and achieve the best possible accuracy without requiring labelled data. In a similar manner, the principles described above may be used and combined for health related recognition models, such as heart rate collection and detection models between different heart rate sensors, and/or heart rate sensors placed on different parts of human or animal body.

Additionally, the principles described above in the example embodiments may be used and combined for models adapted and implemented in one or more industrial processes between different apparatuses and/or sensors. In general, the algorithms described above can be used and combined in the domain shift between any domains, such as sensors, hardware (HW) components, such as microphones, antennas, transmitters, receivers, modems and/or software (SW) applications, such as codecs, or any combination thereof.

Figure 10:
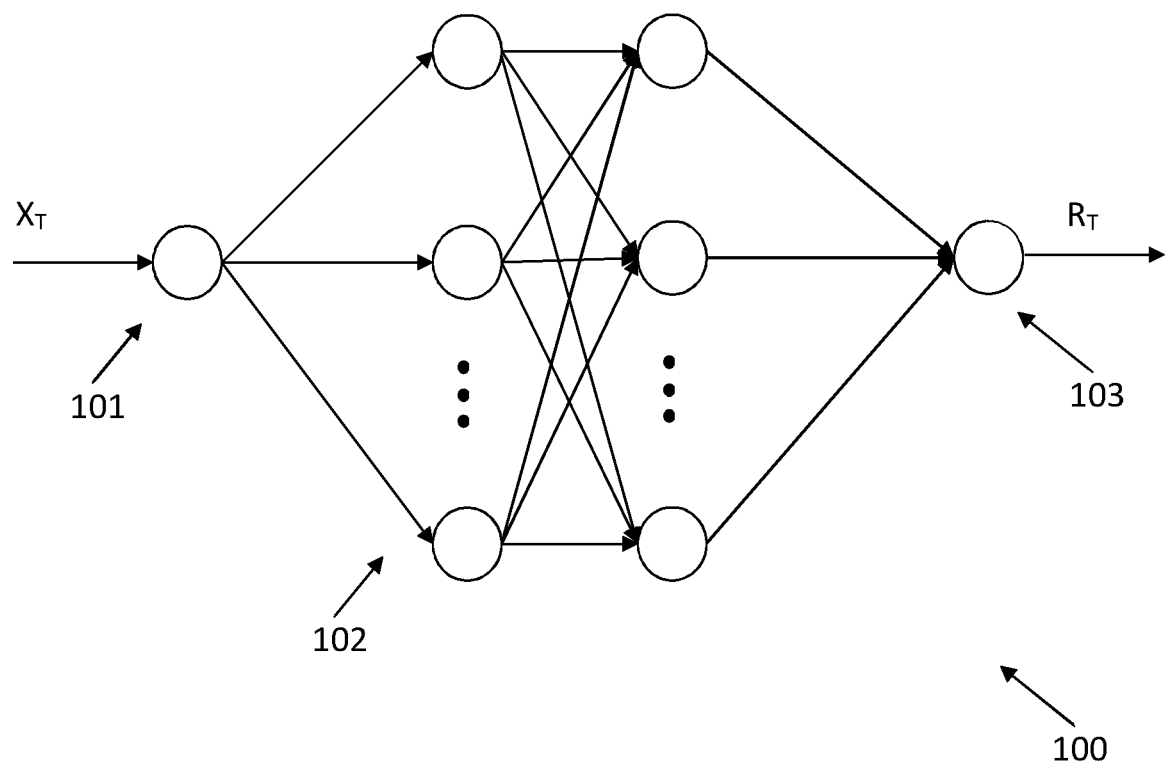
FIG. 10 is a block diagram of a neural network system in accordance with an example embodiment.

Many of the elements described above may be implemented using neural network technology. By way of example, FIG. 10 is a block diagram of a neural network system, indicated generally by the reference numeral 100, in accordance with an example embodiment. The example neural network system 100 is used, by way of example, to implement the target encoder 34 described above Similar neural network systems may be used to implement other modules described here (such as the source encoder 32, the source discriminator 36 and the target discriminator 38).

The system 100 comprises an input layer 101, one or more hidden layers 102 and an output layer 103. At the input layer 101, input data (such as a portion of the target data set) may be received as inputs. The hidden layers 102 may comprise a plurality of hidden nodes, that may be connected in many different ways. At the output layer 103, output data (e.g. target encoder outputs) are generated.

The neural network of the system 100 comprises a plurality of nodes and a plurality of connections between those nodes. The neural network is trained by modifying the nodes, including modifying connections between the nodes and the weighting applied to such connections.

Figure 11:
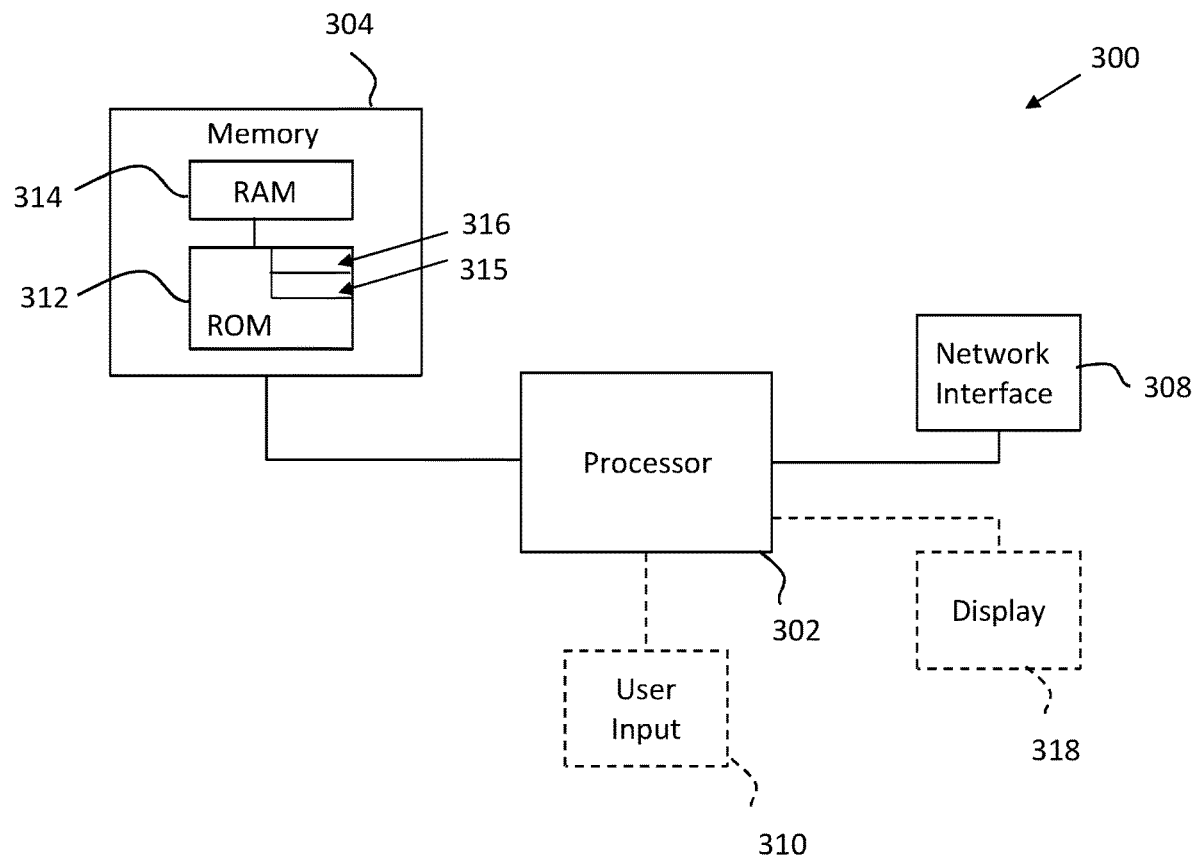
FIG. 11 is a block diagram of components of a system in accordance with an example embodiment.

For completeness, FIG. 11 is an example schematic diagram of components of one or more of the modules for implementing the algorithms in the target and/or the source domains described above, which hereafter are referred to generically as processing systems 300. A processing system 300 may have a processor 302, a memory 304 coupled to the processor and comprised of a RAM 314 and ROM 312, and, optionally, user inputs 310 and a display 318. The processing system 300 may comprise one or more network interfaces 308 for connection to a network, e.g. a modem which may be wired or wireless.

The processor 302 is connected to each of the other components in order to control operation thereof.

The memory 304 may comprise a non-volatile memory, a hard disk drive (HDD) or a solid state drive (SSD). The ROM 312 of the memory 304 stores, amongst other things, an operating system 315 and may store software applications 316. The RAM 314 of the memory 304 is used by the processor 302 for the temporary storage of data. The operating system 315 may contain code which, when executed by the processor, implements aspects of the algorithms 20, 40, 50, 60, 70 and 80.

The processor 302 may take any suitable form. For instance, it may be a microcontroller, plural microcontrollers, a processor, or plural processors. Processor 302 may comprise processor circuitry.

The processing system 300 may be a standalone computer, a server, a console, an apparatus, a user device, a mobile communication device, a vehicle, an IoT device, a sensor, a software application, a communication network, or any combination thereof.

In some example embodiments, the processing system 300 may also be associated with external software applications. These may be applications stored on a remote server device and may run partly or exclusively on the remote server device. These applications may be termed cloud-hosted applications. The processing system 300 may be in communication with the remote server device in order to utilize the software application stored there.

Figure 12A:
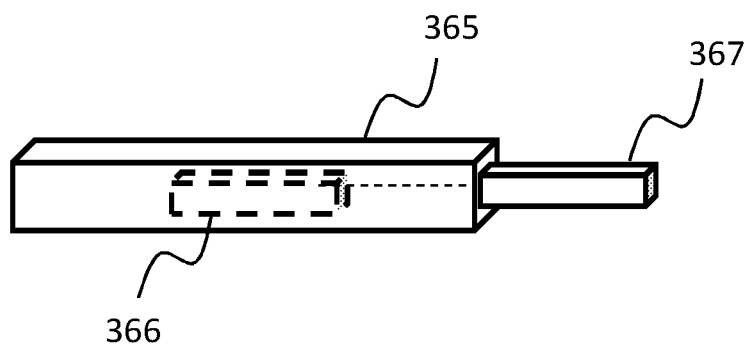
FIGS. 12A and 12B show tangible media, respectively a removable non-volatile memory unit and a Compact Disc (CD) storing computer-readable code which when run by a computer perform operations according to example embodiments.
Figure 12B:
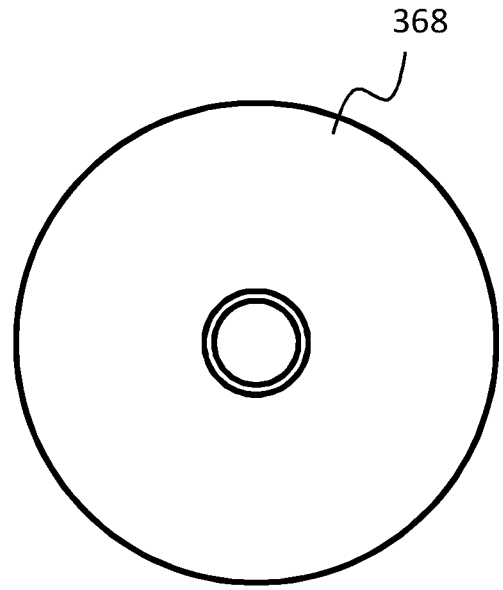

FIG. 12A and FIG. 12B show tangible media, respectively a removable memory unit 365 and a compact disc (CD) 368, storing computer-readable code which when run by a computer may perform methods according to example embodiments described above. The removable memory unit 365 may be a memory stick, e.g. a USB memory stick, having internal memory 366 storing the computer-readable code. The memory 366 may be accessed by a computer system via a connector 367. The CD 368 may be a CD-ROM or a DVD or similar. Other forms of tangible storage media may be used.

Some example embodiments of the present invention may be implemented in software, hardware, application logic or a combination of software, hardware and application logic. The software, application logic and/or hardware may reside on memory, or any computer media. In an example embodiment, the application logic, software or an instruction set is maintained on any one of various conventional computer-readable media. In the context of this document, a "memory" or "computer-readable medium" may be any non-transitory media or means that can contain, store, communicate, propagate or transport the instructions for use by or in connection with an instruction execution system, apparatus, or device, such as a computer.

Reference to, where relevant, "computer-readable storage medium", "computer program product", "tangibly embodied computer program" etc., or a "processor" or "processing circuitry" etc. should be understood to encompass not only computers having differing architectures such as single/multi-processor architectures and sequencers/parallel architectures, but also specialised circuits such as field programmable gate arrays FPGA, application specify circuits ASIC, signal processing devices and other devices. References to computer program, instructions, code etc. should be understood to express software for a programmable processor firmware such as the programmable content of a hardware device as instructions for a processor or configured or configuration settings for a fixed function device, gate array, programmable logic device, etc.

As used in this application, the term "circuitry" refers to all of the following: (a) hardware-only circuit implementations (such as implementations in only analogue and/or digital circuitry) and (b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a server, to perform various functions) and (c) to circuits, such as a microprocessor(s) or a portion of a microprocessor(s), that require software or firmware for operation, even if the software or firmware is not physically present.

If desired, the different functions discussed herein may be performed in a different order and/or concurrently with each other. Furthermore, if desired, one or more of the above-described functions may be optional or may be combined. Similarly, it will also be appreciated that the flow diagrams of FIGS. 2 and 4 to 8 are examples only and that various operations depicted therein may be omitted, reordered and/or combined.

It will be appreciated that the above described example embodiments are purely illustrative and are not limiting on the scope of the invention. Other variations and modifications will be apparent to persons skilled in the art upon reading the present specification.

Moreover, the disclosure of the present application should be understood to include any novel features or any novel combination of features either explicitly or implicitly disclosed herein or any generalization thereof and during the prosecution of the present application or of any application derived therefrom, new claims may be formulated to cover any such features and/or combination of such features.

Although various aspects of the invention are set out in the independent claims, other aspects of the invention comprise other combinations of features from the described example embodiments and/or the dependent claims with the features of the independent claims, and not solely the combinations explicitly set out in the claims.

It is also noted herein that while the above describes various examples, these descriptions should not be viewed in a limiting sense. Rather, there are several variations and modifications which may be made without departing from the scope of the present invention as defined in the appended claims.

The invention claimed is:

1. An apparatus comprising
at least one processor; and
at least one memory including computer program code,
the at least one memory and the computer program configured, with the at least one processor, to cause the apparatus to at least:
initialize weights of a target encoder based on a source encoder, wherein the source encoder implements a first algorithm;
initialize weights of a target discriminator associated with the target encoder such that the target discriminator is initialized to match a source discriminator associated with the source encoder;
apply some of a target data set to the target encoder to generate target encoder outputs;

apply the target encoder outputs to the target discriminator to generate a first local loss function output;
train the target encoder to seek to increase the first local loss function output;
train the target discriminator to seek to decrease the first local loss function output; and
synchronize weights of the target discriminator and the source discriminator by exchanging, via at least a communication link, weights between the target discriminator and the source discriminator, the exchange following the training of the target discriminator and training of the source discriminator.

2. The apparatus as claimed in claim 1, wherein the synchronising of the weights of the target discriminator and the source discriminator is further caused to synchronize weights following a plurality of instances of training of the target discriminator and the corresponding training of the source discriminator.

3. The apparatus as claimed in claim 1, wherein:
the training of the target encoder is further caused to update the weights of the target encoder; and
the training of the target discriminator is further caused to update the weights of the target discriminator.

4. The apparatus as claimed in claim 1, wherein the synchronising of the weights of the target discriminator and the source discriminator is further caused to average the weights of the target and source discriminators.

5. The apparatus as claimed in claim 1, wherein the synchronising of the weights of the target discriminator and the source discriminator is further caused to average changes to the weights of the target and source discriminators.

6. The apparatus as claimed in claim 1, wherein:
the training of the target encoder is further caused to update the weights of the target encoder; and
train the target discriminator comprises accumulating desired changes to the weights of the target discriminator.

7. The apparatus as claimed in claim 6, wherein the synchronising of the weights of the target discriminator and the source discriminator is further caused to average accumulated desired changes to the weights of the target and source discriminators.

8. The apparatus as claimed in claim 1, wherein the initialising of the weights of the target discriminator is further caused to initialize the weights of the target discriminator randomly, pseudo-randomly or arbitrarily.

9. The apparatus as claimed in claim 1, wherein the initialising of the weights of the target encoder is further caused to set the weights of the target encoder to be identical to corresponding weights of the source encoder.

10. The apparatus as claimed in claim 1, wherein the target encoder is implemented using a neural network, wherein the weights of the target encoder are weights of the neural network.

11. The apparatus as claimed in claim 10, wherein the initialising of the target encoder is further caused to receive weights of a source encoder neural network at the target encoder.

12. The apparatus as claimed in claim 1, wherein the target discriminator is implemented using a neural network, wherein the weights of the target discriminator are weights of the neural network.

13. The apparatus as claimed in claim 1, further caused to select an initial instance of the source encoder from a plurality of candidate encoders.

14. The apparatus as claimed in claim 13, wherein the selecting of the initial instance of the source encoder selects an optimum source encoder from the plurality of candidate encoders according to some metric.

15. The apparatus as claimed in claim 14, wherein the metric is related to a divergence between domains.

16. The apparatus as claimed in claim 1, wherein the source encoder is fixed.

17. An apparatus comprising
at least one processor; and
at least one memory including computer program code,
the at least one memory and the computer program configured, with the at least one processor, to cause of the apparatus to at least:
initialize weights of a target encoder based on a source encoder, wherein the source encoder implemented a first algorithm;
initialize weights of a target discriminator, associated with the target encoder, and weights of a source discriminator, associated with the source encoder, such that the target and source discriminators match;
apply some of a target data set to the target encoder to generate target encoder outputs;
apply some of a source data set to the source encoder to generate source encoder outputs;
apply the target encoder outputs to the target discriminator to generate a first local loss function;
apply the source encoder outputs to the source discriminator to generate a second local loss function;
train the target encoder to seek to increase the first local loss function output;
train the target discriminator to seek to decrease the first local loss function output;
train the source discriminator to seek to decrease the second local loss function output; and
synchronize weights of the target discriminator and the source discriminator by exchanging, via at least a communication link, weights between the target discriminator and the source discriminator, the exchange following the training of the target discriminator and the source discriminator.

18. The apparatus as claimed in 17, wherein the source encoder is fixed.

19. A method comprising:
initializing weights of a target encoder based on a source encoder, wherein the source encoder implements a first algorithm;
initializing weights of a target discriminator associated with the target encoder such that the target discriminator is initialized to match a source discriminator associated with the source encoder;
applying some of a target data set to the target encoder to generate target encoder outputs;
applying the target encoder outputs to the target discriminator to generate a first local loss function output;
training the target encoder to seek to increase the first local loss function output;
training the target discriminator to seek to decrease the first local loss function output; and
synchronizing weights of the target discriminator and the source discriminator by exchanging, via at least a communication link, weights between the target discriminator and the source discriminator, the exchange following the training of the target discriminator and corresponding training of the source discriminator.

20. A non-transitory computer program comprising instructions for causing an apparatus to perform at least the following:

initializing weights of a target encoder based on a source encoder, wherein the source encoder implements a first algorithm;

initializing weights of a target discriminator associated with the target encoder such that the target discriminator is initialized to match a source discriminator associated with the source encoder;

applying some of a target data set to the target encoder to generate target encoder outputs;

applying the target encoder outputs to the target discriminator to generate a first local loss function output;

training the target encoder to seek to increase the first local loss function output;

training the target discriminator to seek to decrease the first local loss function output; and synchronizing weights of the target discriminator and the source discriminator by exchanging, via at least a communication link, weights between the target discriminator and the source discriminator, the exchange following the training of said target discriminator and training of the source discriminator.

* * * * *